United States Patent [19]

Williams

[11] Patent Number: 4,763,078

[45] Date of Patent: Aug. 9, 1988

[54] SENSOR FOR ELECTROSTATIC VOLTMETER

[76] Inventor: Bruce T. Williams, 81 Warden St., Lockport, N.Y.

[21] Appl. No.: 844,517

[22] Filed: Mar. 27, 1986

[51] Int. Cl.4 .............................................. G01R 5/28
[52] U.S. Cl. ..................................... 324/458; 324/72
[58] Field of Search .................. 324/457, 458, 72, 725

[56] References Cited

U.S. PATENT DOCUMENTS

| | | | |
|---|---|---|---|
| 3,852,667 | 12/1974 | Williams et al. | 324/72 |
| 4,147,981 | 4/1979 | Williams | 324/458 |
| 4,205,267 | 5/1980 | Williams | 324/458 |
| 4,370,616 | 1/1983 | Williams | 324/458 |
| 4,614,908 | 9/1986 | Daniele et al. | 324/457 X |
| 4,625,176 | 11/1986 | Champion et al. | 324/458 |

FOREIGN PATENT DOCUMENTS 32874  2/1984  Japan ................................... 324/457

Primary Examiner—Reinhard J. Eisenzopf
Assistant Examiner—Robert W. Mueller
Attorney, Agent, or Firm—Christel, Bean & Linihan

[57] ABSTRACT

A sensor for an electrostatic voltmeter comprising an elongated vibratory element supported at one end in the manner of a cantilever beam, a sensitive electrode on the vibratory element near the other end and adapted to be disposed toward an electrical field or potential being measured, a driver chip on the vibratory element for vibrating the element in a direction to vary the capacitive coupling between the electrode and the electrical field or potential being measured, and an amplifier on the vibratory element in direct proximity to the sensitive electrode and having an input connected to the electrode and an output adapted for connection to the electrostatic voltmeter. The amplifier is mounted directly on the vibratory element so as to be in synchronous motion with the electrode. Preferably the electrode is mounted on one side of the vibratory element and the amplifier is mounted on the opposite side. The sensor includes a housing having an operative surface provided with an opening therein, and the vibratory element extends from the surface into the opening and is supported at one end from the surface in the manner of a cantilever beam.

16 Claims, 3 Drawing Sheets

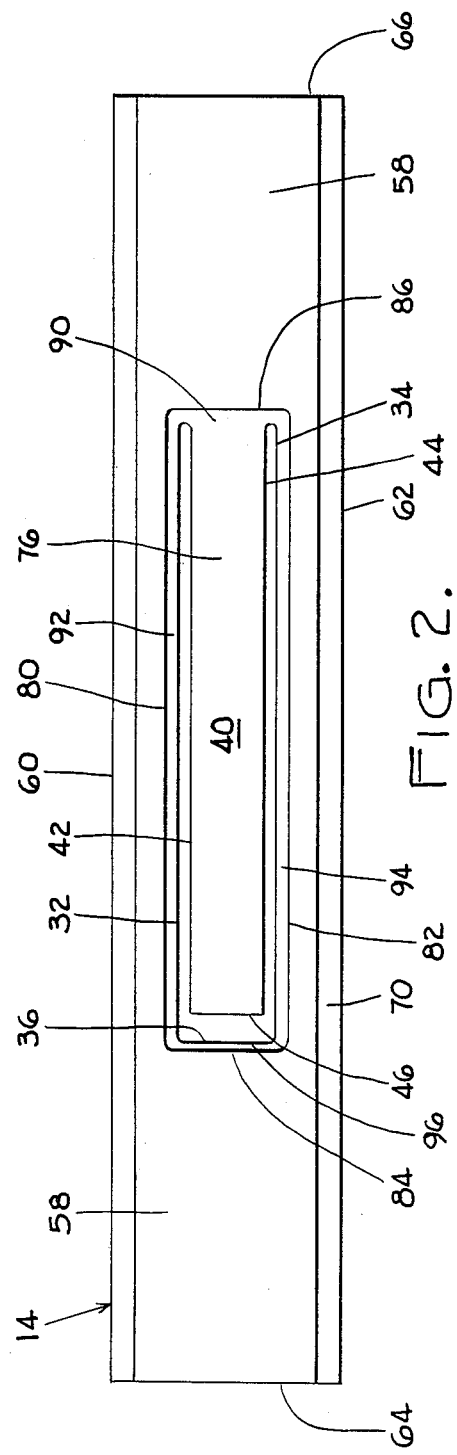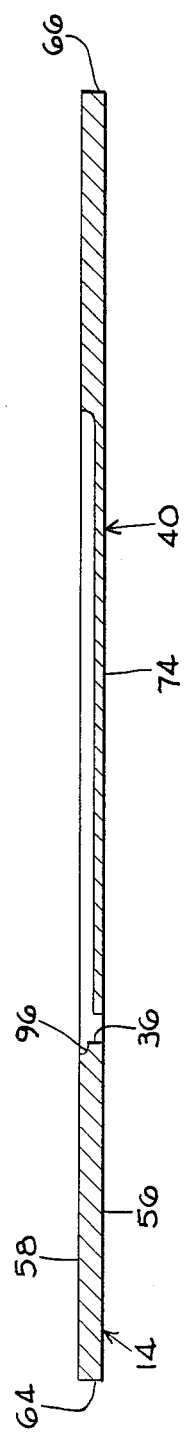

SENSOR FOR ELECTROSTATIC VOLTMETER

BACKGROUND OF THE INVENTION

This invention relates to the electrical measurement art, and more particularly to a new and improved sensor or probe for use on an electrostatic field or electrostatic voltage measuring device.

A device which measures electrostatic fields or electrostatic potential on sufaces without current flow through the device, either capacitive or resistive current, is known as an electrostatic voltmeter. These devices comprise a probe or sensor assembly and an associated voltmeter assembly. The sensor, functioning as an electrostatic detector, is capacitively coupled to the field or surface to be measured, in a non-contacting manner. The voltmeter assembly receives data from the sensor and produces a high quality output signal which is used to drive an indicator or used to control an electrostatic process related to the measurement or both.

Recently it has been determined that the electrostatic processes involved in the electrophotographic process, as used for example in an office copy machine or in a high speed electrostatic printing process, could be greatly enhanced to produce better quality reproductions under conditions of varying ambient conditions, such as humidity changes, temperature changes, or changes in the characteristics of the photoreceptor due to age or use, if the photoreceptor surface voltage is measured during the process. The measurement of the photoreceptor voltage and the production of a signal representative of that voltage would allow for automatic adjustment of the machine process thus producing better quality reproductions with fewer machine adjustments and service.

Heretofore, electrostatic sensors of the type required to produce accurate measurements of photoreceptor surface voltage in the harsh machine environments of high toner contamination, varying humidity and temperature conditions and restricted space availability have not been available. Additionally, the cost of currently available sensors would preclude their use in these machine applications because of their complex nature and high manufacturing costs.

SUMMARY OF THE INVENTION

It is, therefore, a primary object of this invention to provide a new and improved sensor for electrostatic voltmeters.

It is a further object of this invention to provide such a sensor which minimizes or eliminates noise and offset signals thereby avoiding the need for shields or signal guarding systems.

It is a further object of this invention to provide such a sensor which avoids detrimental effects on the sensor electrode due to exposure of the sensor housing to particulate contamination.

It is a further object of this invention to provide such a sensor having high conversion gain.

It is a further object of this invention to provide such a sensor having resistance to shock and vibration.

It is a further object of this invention to provide such a sensor which is small in size, simple in construction, economical to manufacture and reliable in operation.

The present invention provides a sensor for an electrostatic voltmeter comprising an elongated vibratory element supported at one end in the manner of a cantilever beam, a sensitive electrode on the vibratory element near the other end and adapted to be disposed toward an electrical field or potential being measured, driver means on the vibratory element for vibrating the element in a direction to vary the capacitive coupling between the electrode and the electrical field or potential being measured, and an amplifier on the vibratory element in direct proximity to the sensitive electrode means and having an input connected to the electrode and an output adapted for connection to the electrostatic voltmeter. The amplifier is mounted directly on the vibratory element so as to be in synchronous motion with the electrode. Preferably the electrode is mounted on one side of the vibratory element and the amplifier is mounted on the opposite side. The sensor includes a housing having an operative surface provided with an opening therein, and the vibratory element extends from the surface into the opening and is supported at one end from the surface in the manner of a cantilever beam.

The foregoing and additional advantages and characterizing features of the present invention will become clearly apparent upon a reading of the ensuing detailed description together with the included drawing wherein:

BRIEF DESCRIPTION OF THE DRAWING FIGURES

FIG. 2 is a plan view of the bottom surface of the base plate of the sensor of FIG. 1;

FIG. 3 is a longitudinal sectional view of the base plate of FIG. 2;

FIG. 4 is an end elevational view of the base plate of FIG. 2 taken from the right-hand end as viewed in FIG. 2;

DETAILED DESCRIPTION OF THE ILLUSTRATED EMBODIMENT

Figure 1:
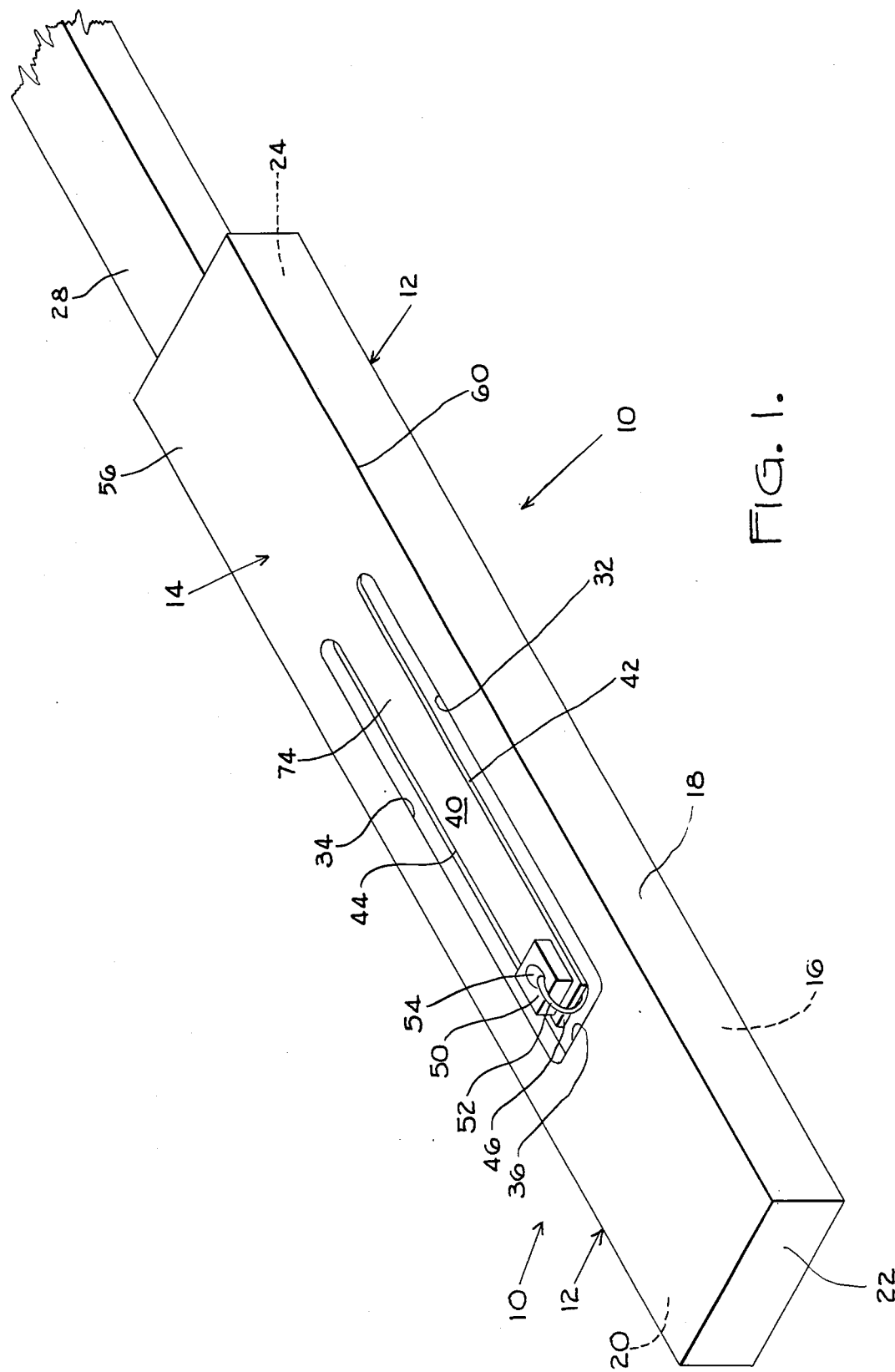
FIG. 1 is a perspective view of a sensor for an electrostatic voltmeter according to the present invention.

Referring now to FIG. 1, a sensor 10 for an electrostatic voltmeter according to the present invention includes a housing generally designated 12 which, in the sensor shown, is elongated rectangular. Housing 12 has an operative surface defined by a base plate 14 which is relatively thin and elongated rectangular. Housing 12 is completed by a bottom plate 16 of the same size and shape as base plate 14, sidewalls 18 and 20 and end walls 22 and 24. A hollow rectangular elongated extension 28 having a cross sectional area smaller than that of housing 12 extends outwardly from end wall 24. In the present illustration, housing 12 and extension 28 have coincident longitudinal axis and extension 28 serves to house conductors leading from sensor 10 to an electrostatic voltmeter (not shown) and also can be used to mount or support the sensor 10.

Base plate 14 is provided with an opening therein defined by a pair of edges 32, 34 extending parallel to the side edges of plate 14 and which are joined by an edge 36 extending laterally of plate 14. Edges 32,34 are mutually parallel, of equal length and are many times longer than edge 36. In the sensor shown, the opening defined by edges 32,34 and 36 is elongated and located substantially midway between the side edges and the end edges of plate 14. In accordance with the present invention, sensor 10 includes an elongated vibratory element 40 extending from the operative surface defined by plate 14, i.e. the outer surface of plate 14, into the opening and supported at one end from the surface in the manner of a cantilever beam. Element 40 is elongated, rectangular and in the form of a relatively thin strip and includes a pair of substantially parallel side edges 42,44 joined by an end edge 46 disposed substantially perpendicular thereto. Edges 42,44 are in closely spaced, substantially parallel relation to edges 32 and 34 of the opening, and edge 46 is in closely spaced, substantially parallel relation to edge 36. In the sensor shown, element 40 is integral with plate 14, and the opening and element 40 can be formed by chemical milling techniques. When element 40 is at rest, it is disposed at a plane substantially parallel to the plane of base plate 14 whereby the structure presents a low profile.

Sensor 10 of the present invention further comprises sensitive electrode means 50 on vibratory element 40 near the free or outer end thereof, i.e. the end opposite the end where element 40 is supported by plate 14, and adapted to be disposed toward an electrical field or potential being measured. Electrode 50 is a small element of suitable metal, relatively thin and rectangular in shape, spot welded or otherwise secured to vibratory element 40 on the outer surface thereof as viewed in FIG. 1, and occupies the end area of element 40 near edges 42,44 and 46. In acordance with the present invention, sensor 10 includes amplifier means (not shown in FIG. 1) on vibratory element 40 in direct proximity to sensitive electrode 50 and having an input connected to electrode 50 and an output adapted for connection to the electrostatic voltmeter. As will be shown and described in detail presently, the amplifier is in the form of a small chip element fixed to the underside of vibratory element 40 as viewed in FIG. 1 and located adjacent end 46. Electrode 50 is connected to the amplifier input by a lead or conductor 52 soldered at one end 54 to electrode 50 as shown in FIG. 1 and extending over along the end edge 46 of element 40 to the amplifier input on the underside of the element 40.

Base plate 14 is illustrated in further detail in FIGS. 2–4 and includes a top surface 56, a bottom surface 58, and a pair of mutually parallel side edges 60,62 which are joined by a pair of end edges 64,66 which are parallel to each other. Along each side edge and in the bottom surface 58 there is formed a recess of generally arcuate cross section extending longitudinally along the entire length of plate 14. In particular, an arcuate recess 68 is provided in bottom surface 58 through about one half the thickness of plate 14 and adjacent side edge 60. Similarly, an arcuate recess 70 is provided in bottom surface 58 through about one half the thickness of plate 14 and adjacent side edge 62. Recesses 68 and 70 together with the adjacent side edges 60, and 62, respectively, define shoulders to enhance the positive fit between the edges of base plate 14 and the corresponding edges of side walls 18 and 20 which would be provided with mating formations along those corresponding edges to fit into the above-identified shoulders.

As shown in FIGS. 2–4, vibratory element 40 has top and bottom surfaces 74 and 76, respectively. The opening in base plate 14 previously described as defined by edges 32,34 and 36 which extend from the plate top surface 56 is outlined by an elongated rectangular recess in plate bottom surface 58 which is defined by a pair of mutually parallel side edges 80 and 82 which are joined by a pair of mutually parallel end edges 84 and 86. The recess extends approximately half way through the thickness of plate 14 to define a planar surface 90 adjacent the supported end of element 40, a pair of shoulder surfaces 92 and 94 extending along edges 32 and 34, respectively, and a shoulder surface 96 extending along edge 36. Thus, as shown in FIG. 3, the thickness of vibratory element 40 is a fraction of the thickness of plate 14, i.e. slightly under one half.

Figure 5:
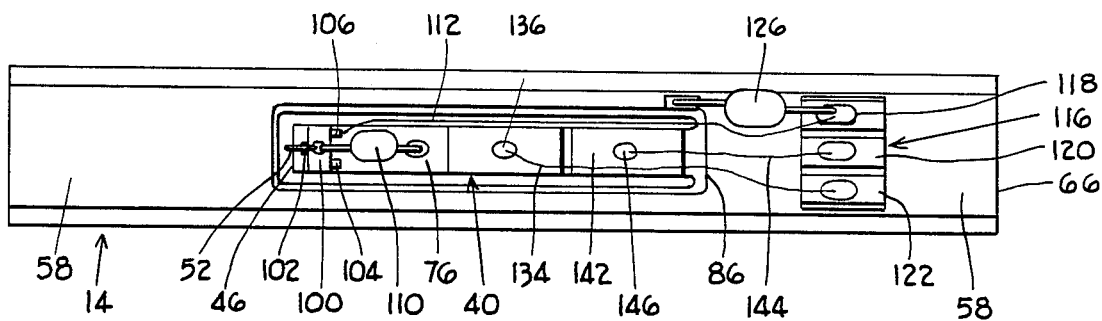
FIG. 5 is a plan view similar to FIG. 2 but showing a sub-assembly with various electrical components on the base plate.
Figure 6:
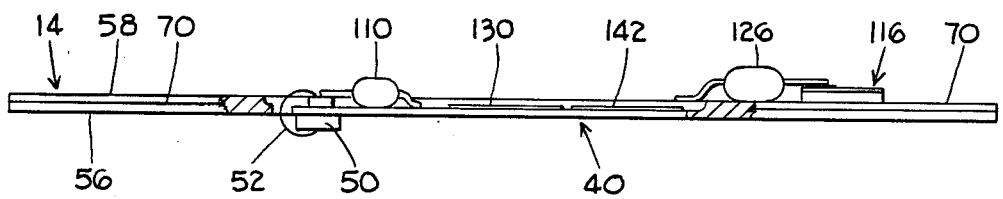
FIG. 6 is a side elevational view, partly in section, of the sub-assembly of FIG. 5.
Figure 7:
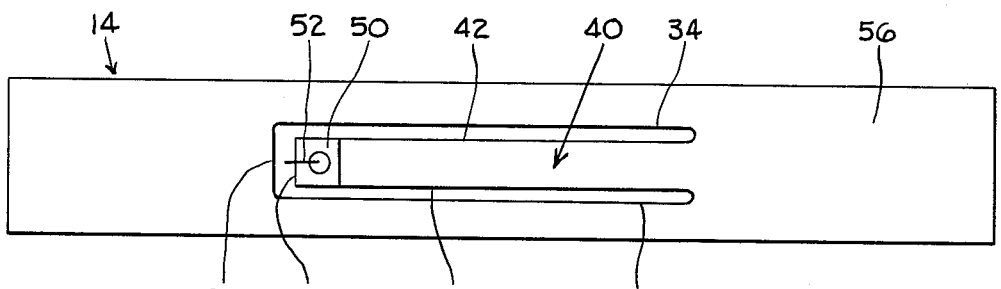
FIG. 7 is a plan view of the opposite surface of the base plate sub-assembly of FIG. 5.

FIGS. 5–7 illustrate a completed sub-assembly of sensor 10 including base plate 14 and various electrical components of sensor 10. In accordance with the present invention, sensor 10 includes amplifier means 100 on vibratory element 40 in direct proximity to sensitive electrode 50. As shown in FIG. 5 amplifier 100 is in the form of a chip element fixed by suitable means such as adhesive to bottom surface 76 of vibratory element 40 and near the end edge 46 thereof. Amplifier 100 is in the device shown in a field effect transistor amplifier having gate, source and drain terminals 102, 104 and 106, respectively. Gate terminal 102 is connected by suitable means such as soldering to the end of lead 52 which is connected to sensing electrode 50 as previously described. Gate terminal 102 also is connected to one lead of a diode 110, the other lead of which is connected to surface 76 of element 40, which, being of metal serves as an electrical reference along with baseplate 14. Source terminal 104 of transistor amplifier 100 is also connected to surface 76 such as by soldering to provide an electrical reference. Drain terminal 106 of amplifier 100 is connected to one end of a lead 112, the other end which is connected to a wire interconnect board 116 having three sections 118,120 and 122 corresponding to signal, drive and feedback connections, respectively, to the electrostatic voltmeter. Board 116 is fixed to surface 58 of plate 14 between end edge 66 and the end edge 86 of the central recess. Lead 112 is connected to the signal section 118 which also is connected to one lead of a Zener diode 126, the other lead of which is connected such as by soldering to plate surface 58 serving as an electrical reference.

There is provided feedback means in the form of a first piezoelectric chip which is fixed to surface 76 of element 40 spaced from diode 110. The feedback chip 130 is electrically connected to feedback section 122 of interconnect board 116 by means of a lead 134, one end of which is connected at 136 such as by soldering to chip 130 and the other end of which is connected such as by soldering feedback section 118. A drive means in the form of a second piezoelectric chip 142 also is provided and is fixed to surface 76 of vibratory element 40 next to feedback chip 130 and near the supported end of element 40. The drive means 142 is electrically connected to the drive section 120 of interconnect board 116 by means of a lead 144, one end of which is connected at 146 such as by soldering to chip 142 and the other end of which is connected to drive section 120. The interconnect board sections 118, 120 and 122 are connected to the ends of conductors in a cable not shown) leading from sensor 10 for connection to the electrostatic voltmeter.

Figure 8:
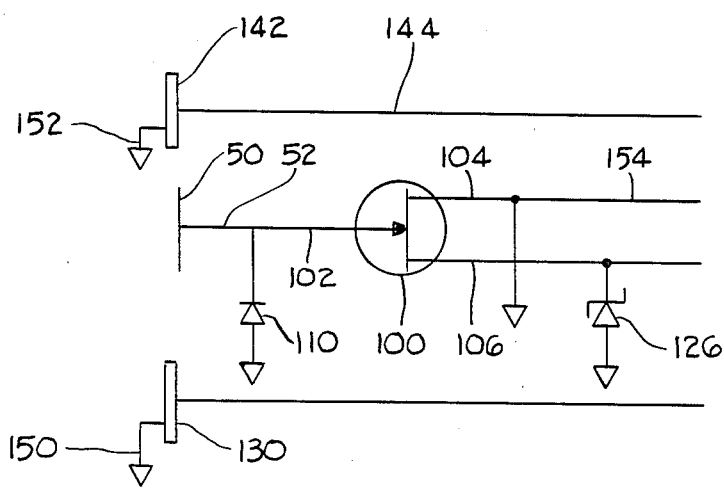
FIG. 8 is a schematic circuit diagram of the arrangement of electrical components illustrated in FIGS. 5-7.

FIG. 8 is a schematic circuit diagram of the arrangement of FIGS. 5–7 wherein like components are identified by like reference numerals. Feedback chip 130 and drive chip 142 have connections 150 and 152, respectively, to electrical ground or reference by virtue of mounting of the chips on the surface of the metal vibratory element 40. The connection of transistor amplifier source terminal 104 to surface 76 also is connected to a lead 154 which is included in the cable leading from sensor 10 and serves as a shield common.

The sensor 10 of the present invention operates in the following manner. Housing 12 is positioned with electrode 50 facing a surface, i.e. a test surface, bearing the electrostatic field or potential to be measured. With the electrode sensitive surface exposed to the test surface there is capacitive coupling between electrode 50 and the test surface. An oscillator (not shown) within the electrostatic voltmeter applies an a.c. voltage through board section 120 and conductor 144 to piezoelectric element 142 causing it to vibrate in a direction generally perpendicular to the plane of plate 14, and at a frequency substantially equal to the oscillator output frequency. The cantilevered element 40 transmits the vibrations of piezoelectric element 142 to electrode 50. Electrode 50 is vibrated in a direction generally perpendicular to the plane thereof and at a frequency determined by the oscillator output frequency and the mechanical characteristics of element 40. As electrode 50 is vibrated it moves toward and away from the test surface thereby varying the capacitive coupling between the electrode sensitive surface and the test surface.

As element 40 vibrates, the motion thereof generates a voltage in piezoelectric element 130 attached to element 40 which is fed back electrically through lead 134 and board section 122 to the oscillator to complete a feedback loop to sustain the oscillation. In particular, the signal fed back representative of the actual vibration or oscillation is compared to a reference signal representative of desired oscillation or vibration, e.g. the amplitude and frequency to control the output of the oscillator. This is done in a manner readily apparent to those skilled in the art so that any further detailed description is believed to be unnecessary.

If the potential of the detector electrode 50, which is the system feedback potential, is different from the potential on the test surface, an a.c. signal is induced on the surface of electrode 50. This induced a.c. signal is applied through lead 52 to the input 102 of preamplifier 100. The amplitude and phase of the induced signal, relative to the drive signal obtained from the oscillator, is dependent on the magnitude and polarity of the difference potential, respectively, of the two surfaces. The output of amplifier 100 is applied through lead 112, board section 118 and the cable to an amplifier (not shown) in the electrostatic voltmeter and then applied to the input of a demodulator (not shown). The synchronous demodulator, using the drive signal obtained from the oscillator as a reference phase, functions to remove the amplitude and phase information from the induced a.c. signal. A line frequency derived oscillator signal can be used to insure that the modulation of any ambient induced signals onto the detector electrode 50 cannot appear as noise after the demodulation process. The demodulated signal, which is a d.c. voltage, then can be amplified in a high gain amplifier, and the output of that amplifier is applied to the input of a suitable device, such as a meter, for continual display and monitoring of the test surface potential.

For a more detailed description of circuits and operation of electrostatic voltmeters for processing signals obtained from capacitance modulation sensors placed in proximity to a test surface, reference may be made to U.S. Pat. Nos. 3,852,667 issued Dec. 3, 1974 entitled Probe For Electrostatic Voltmeter and 4,147,981 issued Apr. 3, 1979 entitled Electrostatic Voltmeter Probe Positioned On the Outside Of A Housing And Vibrated By a Piezoelectric Transducer Within the Housing, the disclosure of each of which is hereby incorporated by reference.

The probe or sensor 10 of the present invention is simple, contains inexpensive components, and uses no shields or signal guarding systems and thus is very low in cost. The unique features of sensor 10 which allow for low construction cost, small size and superior performance include the following. The vibrating element 40, a single cantilever, is fabricated as an integral part of the base plate 14 by use of a chemical milling process. Alternately, the vibrating element 40 could be attached to the base plate 14 by welding, either techniques thus providing a small, thin profile. The preamplifier 100 is attached directly to the vibrating element 40 thereby placing it in direct proximity and in synchronous motion to the sensitive electrode 50. This allows for a direct connection, short in length, between the sensitive electrode 50 and preamplifier 100. A troublesome source of noise and offsets in prior art sensors occurs when a relatively long sensor to amplifier connection, required when the amplifier is mounted on the housing of the sensor assembly, allows the generation of potentials on the wire due to its' motion relative to such voltage sources as amplifier bias voltages, temperature dependent contact potentials associated with different construction metals or contaminated metal surface, or from charged dust or toner contamination within the sensor assembly. Prior art devices inherently relied upon shielding systems to eliminate these extraneous couplings to reduce noise and offset. However, shielding systems are not without difficulties and often shifted the extraneous coupling problem to between the sensor connection and its' shielding system thereby producing a sensor which in using shields, is more expensive to manufacture and only partially solves noise and offset problems. The sensor 10 of the present invention does not employ any shielding but eliminates all of the forementioned sources of extraneous coupling by keeping the sensor connection very short, typically less than 2 mm due to the mounting of the amplifier 100 directly to the vibrating element 40 in direct proximity to the sensitive electrode 50. In addition, the flexing of the sensitive electrode wiring normally encountered in prior art probe designs, being a source of low reliability because of wire stress and breakage, is avoided.

The sensitive electrode 50 is mounted on the outside of the housing 12 and thus accumulation of dust and toner on or in the housing 12 does not produce noise and offsets due to the coupling of the charged dust or toner contamination to the sensitive electrode 50. Additionally, because of the placement of the sensitive electrode on the outside, maximum coupling to the test surface is achieved, thus producing high sensor gain. Outside electrode mounting is very advantageous where, in the case of the present invention, the coupling to the preamplfier 100 is direct, short and non-flexing, thus producing a sensitive electrode-preamplifier system which produces very low noise and offset and is very reliable mechanically.

Another important advantage of the sensitive electrode-preamplfier system of the present invention is its resistance to shock and vibration. Heretofore, in prior art devices, where the preamplifier is mounted to a rigid surface, i.e. to the sensor housing, shock and vibration could produce microphonics and noise on the sensor signal. In the sensor 10 of the present invention, on the other hand, the mounting of the preamplifier 100 to the vibrating element 40 (a cantilever) provides effective shock mounting for the preamplifier 100. Mechanical components of shock and vibrations which fall within the mechanical bandpass of the cantilever 40 will normally cause interference and noise in a hard mounted amplifier. However, at these troublesome frequencies the cantilever 40 is very compliant and will not transmit these frequencies to the amplifier 100 but will simply absorb them, thus acting as a very efficient, inexpensive shock mounting.

By way of example, in an illustrative device, housing 12 has an overall length of about 2.190 inches, a width of about 0.393 inch and a height of about 0.150 inch. The distance from the outer surface of end wall 22 to the center of electrode 50 is about 0.687 inch. The height between base surface 56 and the outermost surface of lead 52 above electrode 50 is about 0.025 inch when sensor 10 is not in operation, and the maximum dimension of this height during operation of sensor 12 is about 0.030 inch. Base plate 14 is of brass, full hard, cleaned and plated with tin or nickel for appearance and solderability. Plate 14 has length of about 2.190 inches, width of about 0.393 inch and thickness of about 0.040 inch. Element 40 has a thickness of about 0.016 inch, a length of about 0.90 inch and a width of about 0.10 inch. The distance between end edges 46 and 96 is about 0.047 inch and each distance between side edges 42 and 32 and between 44 and 34 is 0.027 inch. The distance between end edges 64 and 84 is about 0.580 inch, and each distance between side edges 62 and 34 and between 60 and 32 is about 0.132 inch. Each distance between side edge 80 and recess 68 and side edge 82 and recess 70 is about 0.047 inch. The width of each recess 68,70 is about 0.040 inch and is defined by a radius of 0.024 inch. The distance between the center of electrode 50 and end edge 46 is about 0.046 inch, and amplifier 100 is spaced about 0.040 inch from edge 46. Field effect transistor 100 is type MMBF5457, diode 110 in type FDH 333 and Jener diode 126 is type 1N965B.

It is therefore apparent that the present invention accomplishes its intended objects. While an embodiment of the present invention has been described in detail, that is for the purpose of illustration, not limitation.

I claim:

1. A sensor for an electrostatic voltmeter comprising:
   (a) an elongated vibratory element having two ends;
   (b) means for supporting said vibratory element at one of said ends as a cantilever beam;
   (c) sensitive electrode means on said vibratory element near the other of said ends thereof and disposed directly toward an electrical field or potential being measured having capacitive coupling to said electrode means;
   (d) drive means on said vibratory element for vibrating said element in a direction to vary the capacitive coupling between said electrode means and the electrical field or potential being measured; and
   (e) amplifier means on said vibratory element in direct close physical proximity to said sensitive electrode means and having an input directly connected to said electrode means and an output for connection to the electrostatic voltmeter, the direct connection of said input to said electrode means being sufficiently short to eliminate extraneous coupling thereby avoiding the need for shielding.

2. A sensor according to claim 1, wherein said means for supporting said vibratory element is in the form of a plate having an opening therein and said vibratory element is located in said opening extending from said plate.

3. A sensor according to claim 2, wherein said vibratory element and said plate are integral.

4. A sensor according to claim 2, wherein said plate forms one surface of an elongated hollow housing, and wherein said vibratory element has a surface external to said housing and a surface facing the interior of said housing.

5. A sensor according to claim 4, wherein said electrode means is on said surface of said vibratory element external to said housing and said amplifier means is on said surface of said vibratory element facing the interior of said housing.

6. A sensor according to claim 5, wherein said housing has an interior and wherein said drive means is on the surface of said vibratory element facing the interior of said housing.

7. A sensor according to claim 1, further including feedback means on said vibratory element for connection to the electrostatic voltmeter.

8. A sensor for an electrostatic voltmeter comprising:
   (a) an elongated vibratory element having two ends;
   (b) means for supporting said vibratory element at one of said ends as a cantilever beam;
   (c) sensitive electrode means on said vibratory element near the other of said ends thereof and disposed directly toward an electrical field or potential being measured having capacitive coupling to said electrode means;
   (d) drive means on said vibratory element for vibrating said element in a direction to vary the capacitive coupling between said electrode means and the electrical field or potential being measured; and
   (e) amplifier means on said vibratory element in direct proximity to said sensitive electrode means and having an input connected to said electrode means and an output for connection to the electrostatic voltmeter, said amplifier means being mounted directly on said vibratory element so as to be in synchronous motion with said electrode means.

9. A sensor for an electrostatic voltmeter comprising:
   (a) an elongated vibratory element having two ends;
   (b) means for supportng said vibratory element at one of said ends as a cantilever beam;
   (c) sensitive electrode means on said vibratory element near the other of said ends thereof and disposed directly toward an electrical field or potential being measured having capacitive coupling to said electrode means;
   (d) drive means on said vibratory element for vibrating said element in a direction to vary the capacitive coupling between said electrode means and the electrical field or potential being measured;
   (e) amplifier means on said vibratory element in direct proximity to said sensitive electrode means and having an input connected to said electrode means an an output for connection to the electrostatic voltmeter; and (f) said vibratory element having opposite sides, said sensitive electrode means being on one side and said amplifier means being on the opposite side.

10. A sensor for an electrostatic voltmeter comprising:
(a) a housing including an operative surface having an opening defined therein;
(b) an elongated vibratory element having two ends and extending from said surface into said opening and supported at one of said ends from said surface as a cantilever beam;
(c) sensitive electrode means on said vibratory element near the other of said ends thereof and disposed directly toward an electrical field or potential being measured having capacitive coupling to said electrode means;
(d) drive means on said vibratory element for vibrating said element in a direction to vary the capacitive coupling between said electrode means and the electrical field or potential being measured; and
(e) means for coupling electrical signals developed on said electrode means to the electrostatic voltmeter, said coupling means comprising amplifier means on said vibratory element in direct proximity to said sensitive electrode means and having an input connected to said electrode means and an output for connection to the electrostatic voltmeter, said amplifier means being mounted directly on said vibratory element so as to be in synchronous motion with said electrode means.

11. A sensor according to claim 10, wherein said opening is of a size and shape such that said vibratory element fits closely movably therein.

12. A sensor according to claim 10, wherein said housing surface is planar and said vibratory element and said surface are substantially co-planar when said vibratory element is at rest.

13. A sensor according to claim 10, wherein said vibratory element and said surface are integral.

14. A sensor according to claim 10 wherein said drive means is on the surface of said vibratory element facing the interior of said housing.

15. A sensor according to claim 10, further including feedback means on said vibratory element and adapted for connection to the electrostatic voltmeter.

16. A sensor for an electrostatic voltmeter comprising:
(a) a housing including an operative surface having an opening defined therein;
(b) an elongated vibratory element having two ends and extending from said surface into said opening and supported at one of said ends from said surface as a cantilever beam;
(c) sensitive electrode means on said vibratory element near the other of said ends thereof and disposed directly toward an electrical field or potential being measured having capacitive coupling to said electrode means;
(d) drive means on said vibratory element for vibrating said element in a direction to vary the capacitive coupling between said electrode means and the electrical field or potential being measured;
(e) means for coupling electrical signals developed on said electrode means to the electrostatic voltmeter, said coupling means comprising amplifier means on said vibratory element in direct proximity to said sensitive electrode means and having an input connected to said electrode means and an output for connection to the electrostatic voltmeter; and
(f) said electrode means being on the surface of said vibratory element external to said housing and said amplifier means being on the surface of said vibratory element facing the interior of said housing.

* * * * *